(12) United States Patent
Dürr

(10) Patent No.: US 7,061,226 B2
(45) Date of Patent: Jun. 13, 2006

(54) METHOD TO DETECT A DEFECTIVE ELEMENT

(75) Inventor: Peter Dürr, Dresden (DE)

(73) Assignee: Micronic Laser Systems AB, Taby (SE)

(*) Notice: Subject to any disclaimer, the term of this patent is extended or adjusted under 35 U.S.C. 154(b) by 11 days.

(21) Appl. No.: 10/757,351

(22) Filed: Jan. 14, 2004

(65) Prior Publication Data

US 2004/0207386 A1 Oct. 21, 2004

Related U.S. Application Data

(60) Provisional application No. 60/440,145, filed on Jan. 15, 2003.

(51) Int. Cl.
*G01R 13/20* (2006.01)

(52) U.S. Cl. .................................. 324/121 R

(58) Field of Classification Search ............ 324/121 R; 359/290–298; 430/5, 22, 30, 311
See application file for complete search history.

(56) References Cited

U.S. PATENT DOCUMENTS

| | | | |
|---|---|---|---|
| 4,476,465 A | 10/1984 | Anderson | |
| 4,908,780 A | 3/1990 | Priem et al. | |
| 5,042,950 A | 8/1991 | Salmon, Jr. | |
| 5,123,085 A | 6/1992 | Wells et al. | |
| 5,278,949 A | 1/1994 | Thayer | |
| 5,296,891 A * | 3/1994 | Vogt et al. ..................... | 355/67 |
| 5,323,002 A * | 6/1994 | Sampsell et al. ......... | 250/252.1 |
| 5,504,504 A * | 4/1996 | Markandey et al. ........ | 345/214 |
| 5,533,170 A | 7/1996 | Teitzel et al. | |
| 5,594,854 A | 1/1997 | Baldwin et al. | |
| 5,673,376 A | 9/1997 | Ray et al. | |
| 5,684,510 A | 11/1997 | Brassell et al. | |
| 5,872,902 A | 2/1999 | Kuchkuda et al. | |
| 6,072,500 A | 6/2000 | Foran et al. | |
| 6,169,282 B1 * | 1/2001 | Maeda et al. ............... | 250/310 |
| 6,188,427 B1 | 2/2001 | Anderson et al. | |
| 6,201,545 B1 | 3/2001 | Wong et al. | |
| 6,261,728 B1 | 7/2001 | Lin | |
| 6,285,488 B1 * | 9/2001 | Sandstrom ................... | 359/290 |
| 6,312,134 B1 | 11/2001 | Jain et al. | |
| 6,356,340 B1 | 3/2002 | Spence | |

(Continued)

FOREIGN PATENT DOCUMENTS

EP 0 344 952 A1 12/1989

(Continued)

OTHER PUBLICATIONS

Larry J. Hornbeck "From Cathode Rays to Digital Micromirrors: A History of Electronic Projection Display Technology" Digital Light Processing—Introduction TI Technical Journal Jul.-Sep. 1998 pp. 7-45.

*Primary Examiner*—Jermele Hollington
(74) *Attorney, Agent, or Firm*—Ernest J. Beffel, Jr.; Haynes Beffel & Wolfeld LLP

(57) ABSTRACT

The present invention relates to a method to detect at least one defective pixel in a spatial light modulator comprising numerous pixel elements. The spatial light modulator is imaged to a detector. A relayed image of a first chess-board pattern of pixels in said spatial light modulator is detected by said detector. A relayed image of a second chess-board pattern of pixels in said spatial light modulator is detected, which is inverted to the first chessboard pattern, by said detector. The relayed images of said first and second chess-board patterns are analyzed to detect differences between said detected images and theoretical images thereof.

47 Claims, 8 Drawing Sheets

U.S. PATENT DOCUMENTS

| | | |
|---|---|---|
| 6,399,261 B1 | 6/2002 | Sandstrom |
| 6,618,185 B1 | 9/2003 | Sandstrom |
| 6,751,005 B1 * | 6/2004 | Barnick et al. ............. 359/290 |
| 6,813,062 B1 * | 11/2004 | Sandstrom ................. 359/292 |
| 6,859,275 B1 * | 2/2005 | Fateley et al. ............. 356/330 |
| 2002/0122237 A1 * | 9/2002 | Sandstrom et al. ......... 359/291 |

FOREIGN PATENT DOCUMENTS

| | | |
|---|---|---|
| EP | 0 814 431 A2 | 12/1997 |
| EP | 0 851 387 A2 | 7/1998 |
| JP | 09258339 A * | 10/1997 |
| WO | WO 00/49577 | 8/2000 |

* cited by examiner

METHOD TO DETECT A DEFECTIVE ELEMENT

RELATED APPLICATIONS

The present application claims the benefit of and priority to U.S. Provisional Application Ser. No. 60/440,145, filed on 15 Jan. 2003, entitled Method to Detect a Defective Element.

TECHNICAL FIELD

The present invention relates to a detection method, in particular it relates to a method to detect partially or completely defective pixels in a spatial light modulator.

BACKGROUND OF THE INVENTION

Modern UV-lithography is searching for new highly parallel writing concepts. Spatial light modulation (SLM) with optical MEMS devices offers such possibilities. Special emphasis must be put on the ability of SLM devices to handle ultraviolet light (UV), deep ultraviolet light (DUV) and extreme ultraviolet light (EUV).

A SLM chip may comprise a DRAM-like CMOS circuitry with several million individually addressable pixels on top. Said pixels are deflected due to an electrostatic force between a mirror element and an address electrode.

For good performance of the SLM chip almost every single pixel must work and moreover they must respond to an applied voltage similarly enough to be able to compensate for the differences by calibration.

Using a white light interferometer has earlier created a map of defective pixels. Software identified the individual pixels and calculated the deflection angles automatically. Such a method finds quite well not only fabrication errors, but also additional errors that occurred during operation. On the other hand such method is rather slow, as a high magnification implies that many images have to be taken. As the size of the SLM chips are growing, and thereby the number of pixels, more and more pixels has to be analyzed. Preferably the SLM chips also have to be analyzed in a faster way than what is done today. Therefore, what is needed in the art is a faster way to get information about defective pixels of a particular SLM chip.

SUMMARY OF THE INVENTION

Accordingly, it is an object of the present invention to provide a method for detecting defective pixels in a spatial light modulator with reduced process time.

This object, among others, is according to a first aspect of the invention attained by a method to detect one or a plurality of defective pixels in a spatial light modulator, comprising the actions of: providing an electromagnetic radiation source to illuminate said spatial light modulator, arranging a reference pattern in said spatial light modulator, illuminating said spatial light modulator, determining a position of a reference pixel in said spatial light modulator by detecting a relayed image of said reference pattern in a detector arrangement, arranging a first pattern in said spatial light modulator, illuminating said spatial light modulator, detecting a relayed image of said first pattern in said detector arrangement, arranging at least a second pattern in said spatial light modulator, illuminating said spatial light modulator, detecting a relayed image of said at least a second pattern in said spatial light modulator, analyzing said relayed images of said first pattern and said at least a second pattern to detect differences between said images and theoretical images thereof.

In another embodiment according to the present invention said first and second patterns are chessboard patterns, where the first chessboard pattern is inverted to the second chessboard pattern.

In still another embodiment according to the invention the relayed image is detected by a CCD camera.

In yet another embodiment according to the present invention the projection of a SLM pixel is bigger than a CCD pixel.

In yet another embodiment according to the present invention single pixels in the spatial light modulator are not resolved in said detector.

In yet another embodiment according to the present invention a spatial filter between the detector and the spatial light modulator is adapted to vary the degree of resolution on said detector.

In yet another embodiment according to the present invention at least one of said first and second patterns is detected by illuminating said pattern at least twice and detecting the relayed images separately.

In yet another embodiment according to the present invention at least one of said first and second patterns is comprised of only non deflected and fully deflected pixels.

In yet another embodiment according to the present invention said fully deflected pixels correspond to a maximum degree of extinction by means of diffraction.

In yet another embodiment according to the present invention said chessboard patterns are comprised of only non-deflected and fully deflected pixels.

In yet another embodiment according to the present invention said chessboard patterns are comprised of only non-deflected and partially deflected pixels.

In yet another embodiment according to the present invention said fully deflected pixels corresponds to a maximum degree of extinction by means of diffraction.

In yet another embodiment according to the present invention said partially deflected pixels corresponds to partial extinction by means of diffraction.

In yet another embodiment according to the present invention said first and second patterns are each detected a plurality of times, where the pixels in said patterns are set to different degrees of deflection before each detection event.

In yet another embodiment according to the present invention said chessboard patterns are comprised of only fully-deflected and partially deflected pixels.

In yet another embodiment according to the present invention said chessboard patterns are comprised of pixels being in a first partially deflected state and a second partially deflected state.

The invention also relates to a method to detect at least one defective pixel in a spatial light modulator comprising numerous pixel elements, comprising the actions of: detecting a relayed image of a first chessboard pattern of pixels in said spatial light modulator by said detector, detecting a relayed image of a second chessboard pattern of pixels in said spatial light modulator, which is inverted to the first chessboard pattern, by said detector, analyzing the relayed images of said first and second chessboard patterns to detect differences between said detected images and theoretical images thereof.

In another embodiment according to the present invention a CCD camera detects the relayed images.

In still another embodiment according to the present invention a SLM pixel is bigger than a CCD pixel.

In yet another embodiment according to the present invention single pixels in the spatial light modulator are not resolved in said detector.

In yet another embodiment according to the present invention a spatial filter between the detector and the spatial light modulator is adapted to vary the degree of resolution of said relayed image on said detector.

In yet another embodiment according to the present invention at least one of said first and second patterns is detected by illuminating said pattern at least twice and detecting the relayed images separately.

In yet another embodiment according to the present invention said chessboard patterns are comprised of only non-deflected and fully deflected pixels.

In yet another embodiment according to the present invention said chessboard patterns are comprised of only non-deflected and partially deflected pixels.

In yet another embodiment according to the present invention said fully deflected pixels correspond to a maximum degree of extinction by means of diffraction.

In yet another embodiment according to the present invention said partially deflected pixels correspond to partial extinction by means of diffraction.

In yet another embodiment according to the present invention said first and second patterns are each detected a plurality of times, where the pixels in said patterns are set to different degrees of deflection before each detection event.

In yet another embodiment according to the present invention said chessboard patterns are comprised of only fully-deflected and partially deflected pixels.

In yet another embodiment according to the present invention said chessboard patterns are comprised of pixels being in a first partially deflected state and a second partially deflected state.

In yet another embodiment the present invention further comprising the action of identifying a SLM reference pixel in a detector pixel grid.

The invention also relates to a method to detect at least one defective pixel in a spatial light modulator, comprising the action of making an image of a first chessboard pattern unsharp so that a regular chessboard pattern becomes a uniform background at a detector plane and a defective pixel becomes an irregularity in said uniform background at said plane and detectable by a detector.

In another embodiment the present invention further comprising the action of making an image of a second chessboard pattern, which second pattern is inverted to said first pattern, unsharp so that a regular chessboard pattern becomes a uniform background at a detector plane and a defective pixel becomes an irregularity in said uniform background at said plane and detectable by a detector.

In yet another embodiment of the present said detector is a CCD camera.34.

In yet another embodiment according to the present invention a projection of a SLM pixel onto said CCD is bigger than a CCD pixel.

In yet another embodiment according to the present invention said first or second chessboard patterns are comprised of only non-deflected and fully deflected pixels.

In yet another embodiment of the present invention said first or second chessboard patterns are comprised of only non-deflected and partially deflected pixels.

In yet another embodiment according to the present invention said fully deflected pixels correspond to a maximum degree of extinction by means of diffraction.

In yet another embodiment according to the present invention said partially deflected pixels correspond to partial extinction by means of diffraction.

In yet another embodiment according to the present invention said first or second chessboard patterns are comprised of only fully-deflected and partially deflected pixels.

In yet another embodiment said first or second chessboard patterns are comprised of pixels being in a first partially deflected state and a second partially deflected state.

In yet another embodiment said invention further comprising the action of identifying an SLM reference pixel in a detector pixel grid.

Further characteristics of the invention, and advantages thereof, will be evident from the detailed description of preferred embodiments of the present invention given hereinafter and the accompanying FIGS. 1–10, which are given by way of illustration only, and thus are not limitative of the present invention.

DETAILED DESCRIPTION

The following detailed description is made with reference to the Figures. Preferred embodiments are described to illustrate the present invention, not to limit its scope, which is defined by the claims. Those of ordinary skill in the art will recognize a variety of equivalent variations on the description that follows.

Further, the preferred embodiments are described with reference to an analogue spatial light modulator (SLM). It will be obvious to one ordinary skill in the art that there may be situations when other SLMs than analogue ones will be equally applicable; for example digital SLMs like a digital micromirror device DMD made by Texas instruments. Additionally, SLMs may comprise reflective or transmissive pixels.

The invention relates to a method to detect defects in the SLM. Such a method is useful when patterning a workpiece using said spatial light modulator (SLM).

Figure 1:
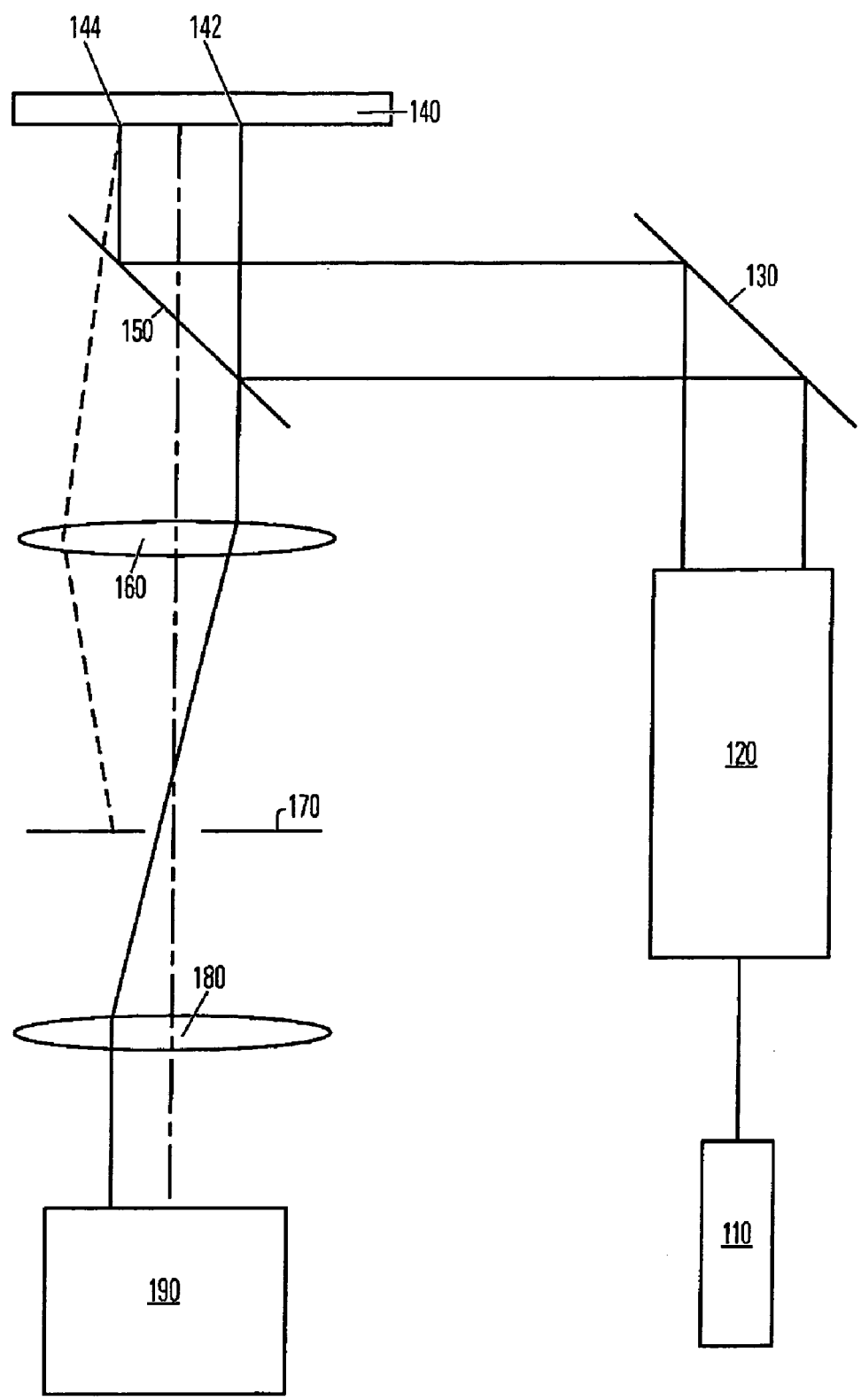
FIG. 1 depicts a test unit for detecting defective SLM pixels.

FIG. 1 illustrates an optical test unit for detecting defective pixels in the spatial light modulator. The optical test unit is built similar to a lithographic pattern generator. The optical test unit comprises a laser source 110, a beam homogenizing and shaping device 120, a mirror 130, a beam splitter 150, a spatial light modulator 140, a Fourier lens 160, a spatial filter 170, an imaging lens 180 and a detecting device 190 for monitoring the aerial image.

The laser source 110 may be an excimer laser emitting 248 nm DUV pulses. Said pulses is homogenized and shaped by the homogenizing and shaping device 120. Said device 120 comprises optics such that plane waves expose the surface of the SLM 140. As deflection angles of SLM pixels in an analogue spatial light modulator is very small, in the range of micro radians if the shape of the SLM pixel is rectangular with sides being 16 micro meters long, the surface of it has to be considered as a blazed grating. In any area with deflected pixels the light is diffracted into non-zero orders and absorbed by an aperture or spatial filter 170. Only very little stray light reaches the detecting device 190 in the corresponding area. The detecting device 190 may be a CCD camera. The Fourier lens 160 ensures that the performance is the same for each pixel position on the SLM. For flat areas with non-deflected pixels most of the light is reflected as a zeroth diffraction order, transferred by the spatial filter 170 and focused by the imaging lens 180 to create a bright area in the CCD camera 190. This is illustrated by a solid ray construction starting at point 142 in FIG. 1. Starting point 142 may be a single or a plurality of pixel elements in the spatial light modulator.

A deflected SLM pixel, diffract a non-negligible amount of light in higher diffraction orders, such as the first, second third etc. The spatial filter 170 blocks diffraction orders higher than a predetermined diffraction order, being for example the first diffraction order. This is illustrated by a dashed ray construction starting at point 144 in FIG. 1. The point 144 may represent a single or plurality of pixels in a deflected state. The deflection of the pixel will extinguish a certain amount of the light reflected into the zeroth order because of destructive interference. The more the pixel is deflected the more the light will be extinguished (for small deflections only, after maximum extinction some intensity will come back), and at a certain degree of deflection maximum extinction is achieved. By increasing the size of the aperture 170 the image would be sharper and a checkerboard pattern would not give a uniform gray background. The reason for this is that higher orders of diffraction would pass said aperture. An increase in the aperture 170 also affect the degree of deflection for reaching the same degree of extinction as with a smaller aperture 170, a bigger aperture requires the pixel element to deflect more for achieving the same level of extinction given the same size of the pixel element.

An optical demagnification may be chosen such that one SLM-pixel is imaged to approximately 2 by 2 camera pixels. Due to the spatial filter the optics does not fully resolve single pixels. An embodiment, which does not fully resolve single square shaped SLM pixels with sides being 16 μm long, has a numerical aperture NA of 0.009 at an image plane, here the detecting device 190, and a numerical aperture NA of 0.0045 at an object plane, here the spatial light modulator 140, with an illuminating wavelength of 248 nm. With another demagnification, pixel size and wavelength said NA would be different. Therefore, the image of for example a "black" pixel in a "white" background is imaged as an unsharp dark spot. Appearance and peak value in the camera depend on the relative position of the SLM pixel to a camera pixel grid, see FIGS. 3–8. The sum of pixel values, however, is almost independent of this relative alignment. A position of a defective pixel is found by calculating the center of gravity of a plurality of camera pixel values.

Figure 3:
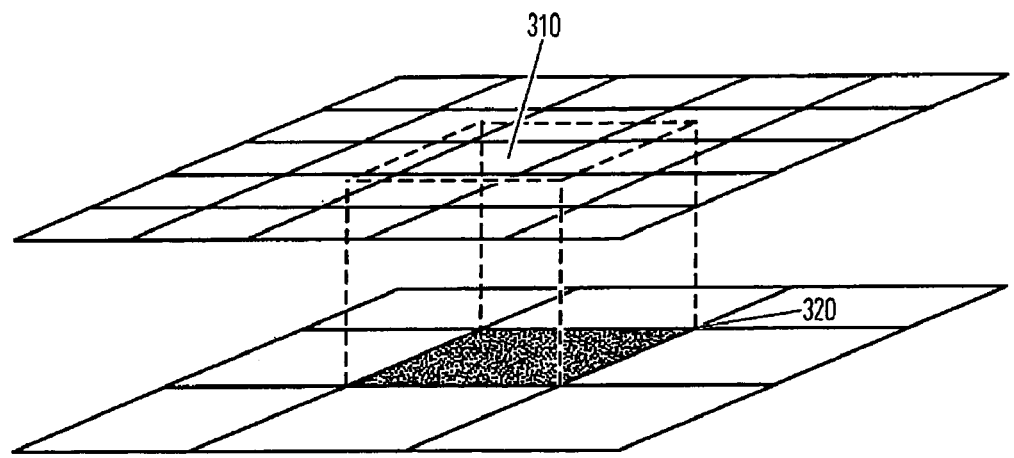
FIG. 3 depicts a perspective view of a camera pixel and a SLM pixel, which are aligned to each other center to center.

FIG. 3 illustrates a camera pixel 310, aligned with a single defective SLM pixel 320. As the projected size of the SLM pixel is most probably not an integer multiple of the camera pixel size, some of the SLM pixels happen to sit symmetrically on (and around) a camera pixel, while the center of other SLM pixels fall on the border between camera pixels. Most of the SLM pixels will have an arbitrary position without symmetry with respect to a camera pixel grid. As long as the camera pixels are smaller than the SLM pixels this will not affect the performance of the inventive detection method.

Figure 5:
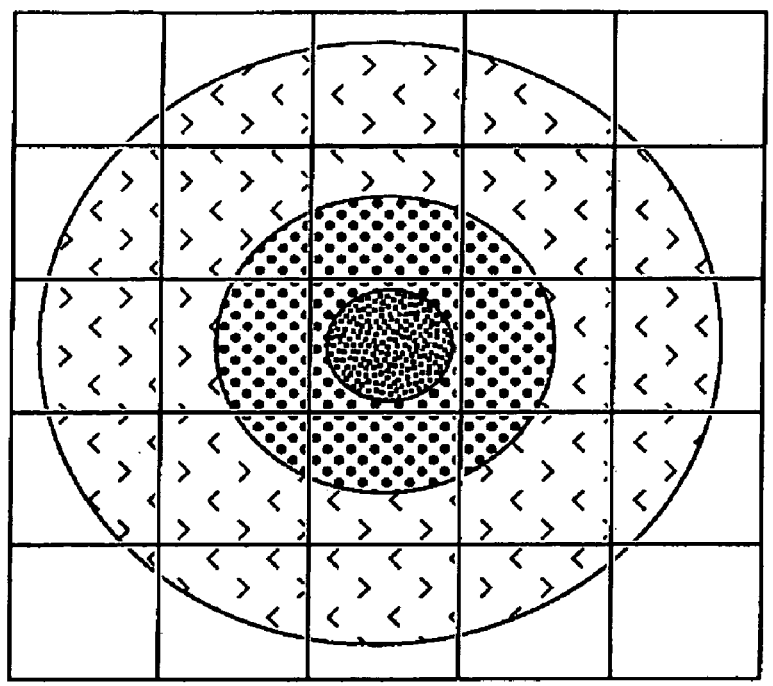
FIG. 5 depicts the illumination from the chip pixel in FIG. 3 onto said camera pixels.

FIG. 5 depicts the illumination of the defective SLM pixel 320 onto the camera pixels 310. As can be seen from the Figure, the size and shape of the illumination is different to a real size of the SLM pixel. This is a result of diffraction and properties of the optics not to resolve single pixels. The result is a blurred image of the SLM pixel, which affect a greater number of camera pixels than would have been the case with optics resolving said single pixel. The center of gravity of said illumination may easily be determined by comparing detected illumination of different camera pixels.

Figure 4:
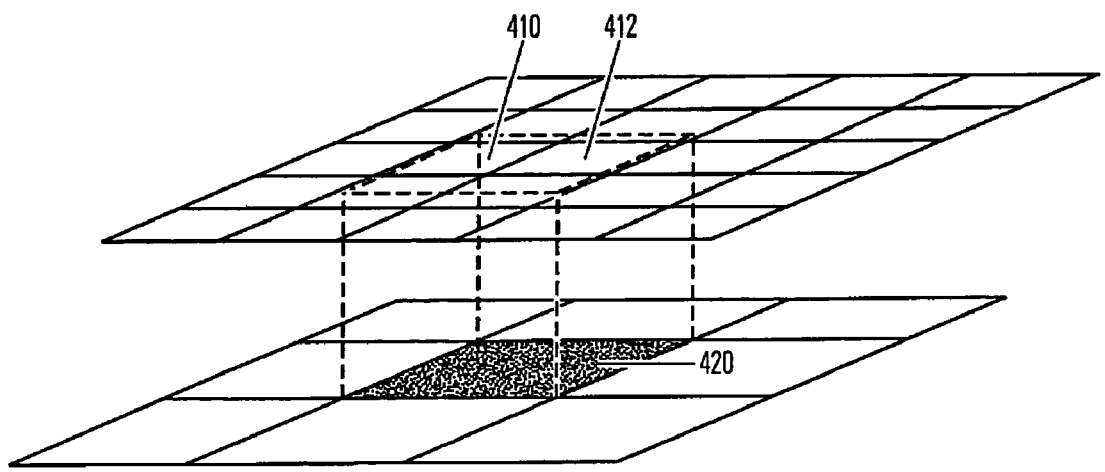
FIG. 4 depicts a perspective view of a camera pixel and a SLM pixel, which are not aligned with each other.

FIG. 4 illustrates an example of when the center of a defective SLM pixel 420 falls on the border between two camera pixels 410, 412.

Figure 6:
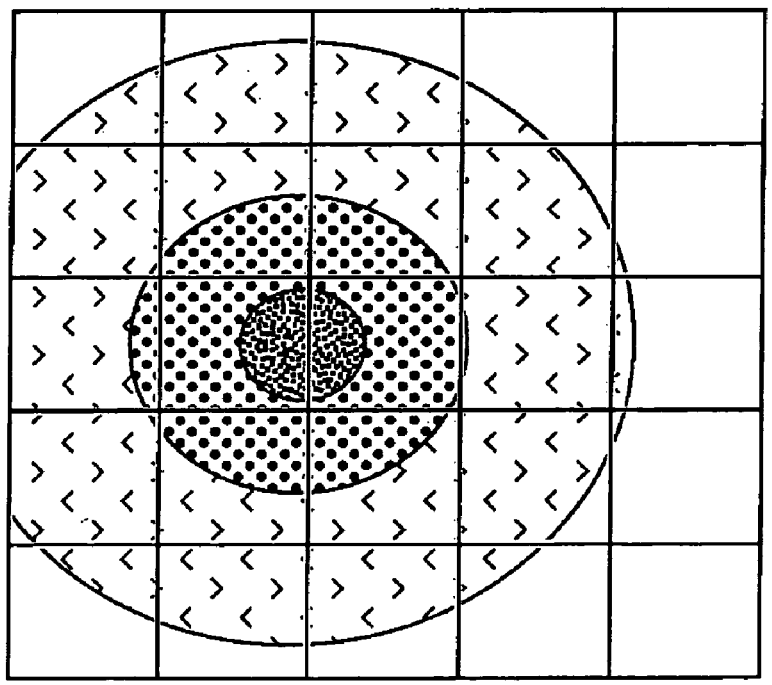
FIG. 6 depicts the illumination from the chip pixel in FIG. 4 onto said camera pixels.

FIG. 6 depicts the illumination of the defective SLM pixel 420 onto the camera pixel grid. As can be seen from FIG. 6, the size and shape of the illumination is equal to the one depicted in FIG. 5, the only difference is the position of the center of gravity of said illumination in said camera pixel grid.

Figure 7:
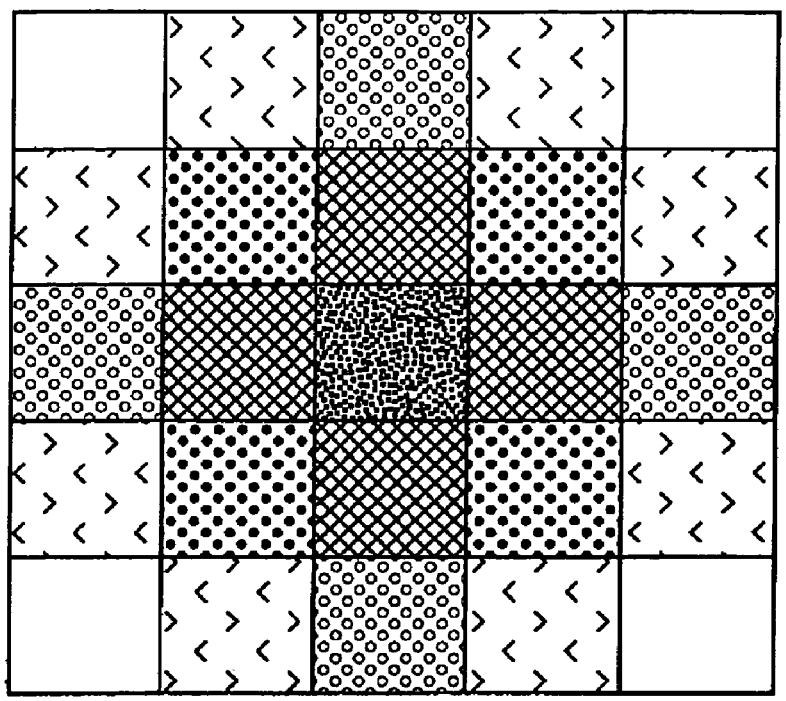
FIG. 7 depicts the output of the camera for the illumination in FIG. 5.
Figure 8:
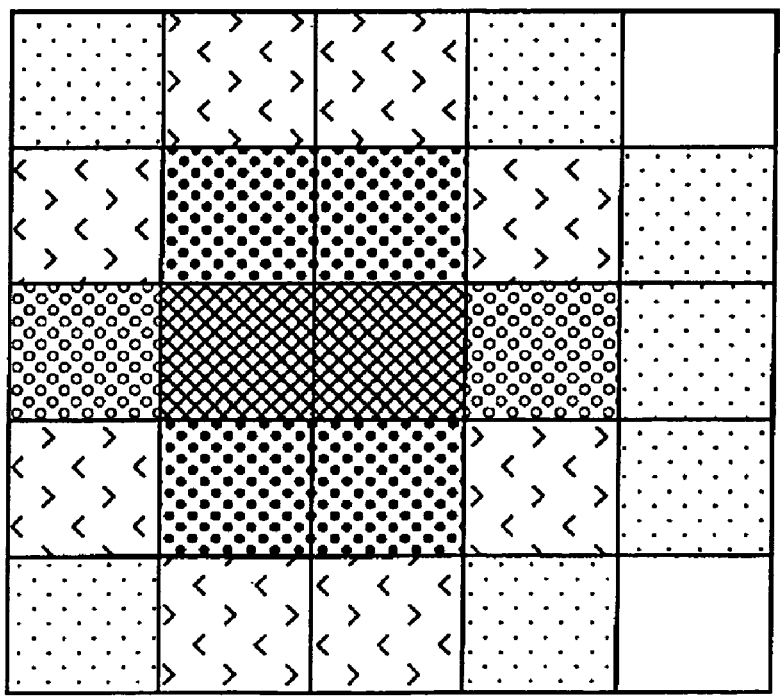
FIG. 8 depicts the output of the camera for the illumination in FIG. 6.

FIG. 7 illustrates an output from the detecting device 190 when being illuminated as depicted in FIG. 5. FIG. 8 illustrates the output from the detecting device 190 when being illuminated as depicted in FIG. 6.

By a coordinate transformation an absolute position of a defective SLM pixel can be calculated. To find parameters for this coordinate transformation an image with a few straight lines may be written to the SLM chip. These may be recognized in the CCD camera response by a Hough transformation, which is very insensitive to noise and defects.

Commercial CCD cameras may be too small to view the whole SLM chip at one time. The CCD camera may comprise 1536 by 1024 pixels, which may only be enough to cover a portion of SLM pixels, for instance about one third of the number of SLM pixels. Therefore, only a portion of said SLM may be tested at one time. The SLM can be mounted on a slider and shifted to different positions and the test may be repeated for each position.

Figure 2:
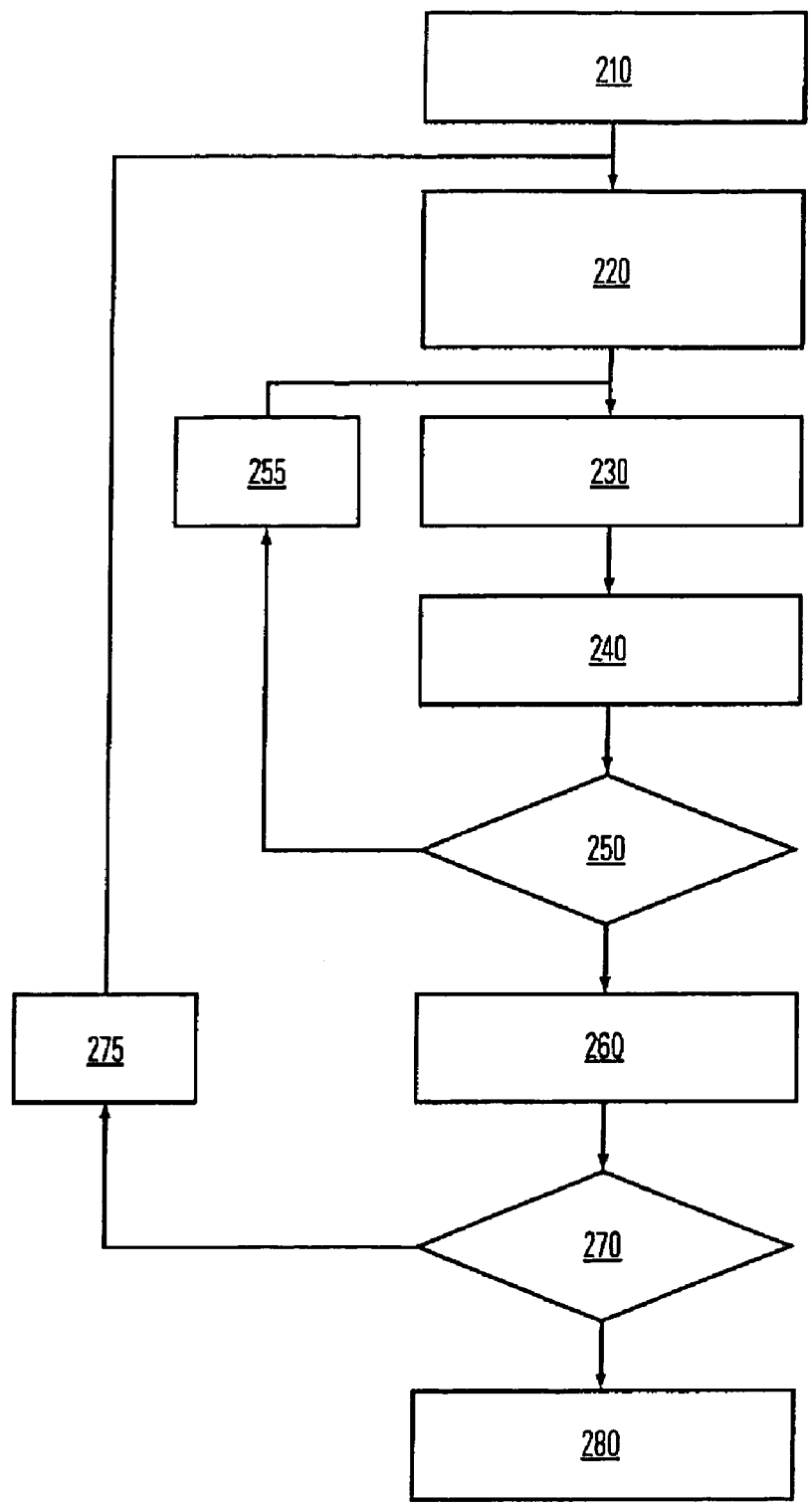
FIG. 2 depicts a flow diagram over an embodiment of a test procedure according to the invention.

FIG. 2 illustrates a flow chart of an embodiment of a test procedure according to the present invention. Defective pixels may be divided into different categories. Pixels may be weakly or not responding to an address signal. This might be a mechanical or an electrical problem. An SLM pixel may always be deflected. The reason for this may be that the pixels are stuck to an electrode, or permanent damage to hinges attached to said pixels. The pixel may reflect electromagnetic radiation poorly. The cause for that may be dust particles on the pixel, a fabrication defect or laser damage to the mirror. Lastly, an electrical short cut between adjacent pixels may cause said pixels to always deflect in the same manner.

Defects of the above mentioned categories might be found by an inventive procedure, which in its simplest version only comprises three images of each position of the SLM. One image is used for position reference and the other two for detecting defective pixels. The positioning of the SLM relative the CCD camera may be performed as follows. By using the reproductive principle of pattern writing on the chip, white lines may be regularly written on a black background. White lines on a black background are superior to black lines in a white background, due to the fact that the background around the chip is dark. No pre-process is then necessary to eliminate the chip surrounding. Lines may be recognized in a robust way bay means of a Hough transformation, allowing independence from noise. With line equations, parameters such as intersection points, scale and angle may be computed.

Due to the finite resolution of the imaging optics with the spatial filter 170, a chessboard pattern free of defects is transferred to a uniform gray background in the camera. Single defective pixels show up as dark or bright spots, respectively.

A single not responding pixel in a chessboard pattern will result in a bright spot that should be easily distinguishable from the background. Possible not responding pixels that are supposed to be flat in this chessboard pattern will always be found in the inverted chessboard pattern. Pixels that are erroneously deflected or poorly reflecting will similarly create a dark spot.

The test procedure as illustrated in FIG. 2 starts with a chip position initialization 210, which means that a particular area of the SLM chip is going to be investigated. Thereafter a characteristic pattern is written on the SLM for position recognition 220. Position recognition comprises an alignment of the SLM chip with the CCD camera. When the alignment is finished a defect detection of the SLM chip can start. A picture of a chessboard pattern is taken in step 230; said picture is analyzed in step 240. Step 250 checks if every kind of chessboard pattern has been written to the SLM chip. If yes, a comparison if the single analysis results are performed 260. If no, next pattern is written to the SLM chip 255. Step 270 checks if every position of the SLM is investigated. If no, next position is analyzed 275. If yes a defective pixel map is built out of the results.

A defect free SLM with a chess-board pattern, which is detected with a CCD camera at a detector plane, will appear in the camera as a uniform gray picture. The detector plane is at equal or equivalent distance to said spatial light modulator as an image plane in a pattern generator using such a spatial light modulator as a programmable reticle/mask. Defects will appear as stains, darker or brighter than the surrounding depending on the type of defect. In case of a noise, which is not uniform, stains may be hidden in said noise. In case it is possible to know the nature of noise (source, statistical parameter or deterministic), a preprocess can be used to reduce or eliminate the effect of said noise. Time averaging can reduce statistical noise. Filters for statistical or time varying deterministic noise depend on the type of noise. If the noise is deterministic and time unvarying, a reference picture featuring the noise can be subtracted to the noisy picture in question. The ideal is to have a reference mirror that fills the whole image.

Comparing a theoretical image of a relayed pattern in the SLM and a detected pattern performs the analyzing step. Deviations in the detected pattern from the theoretical one correspond to defective pixel(s).

Figure 9:
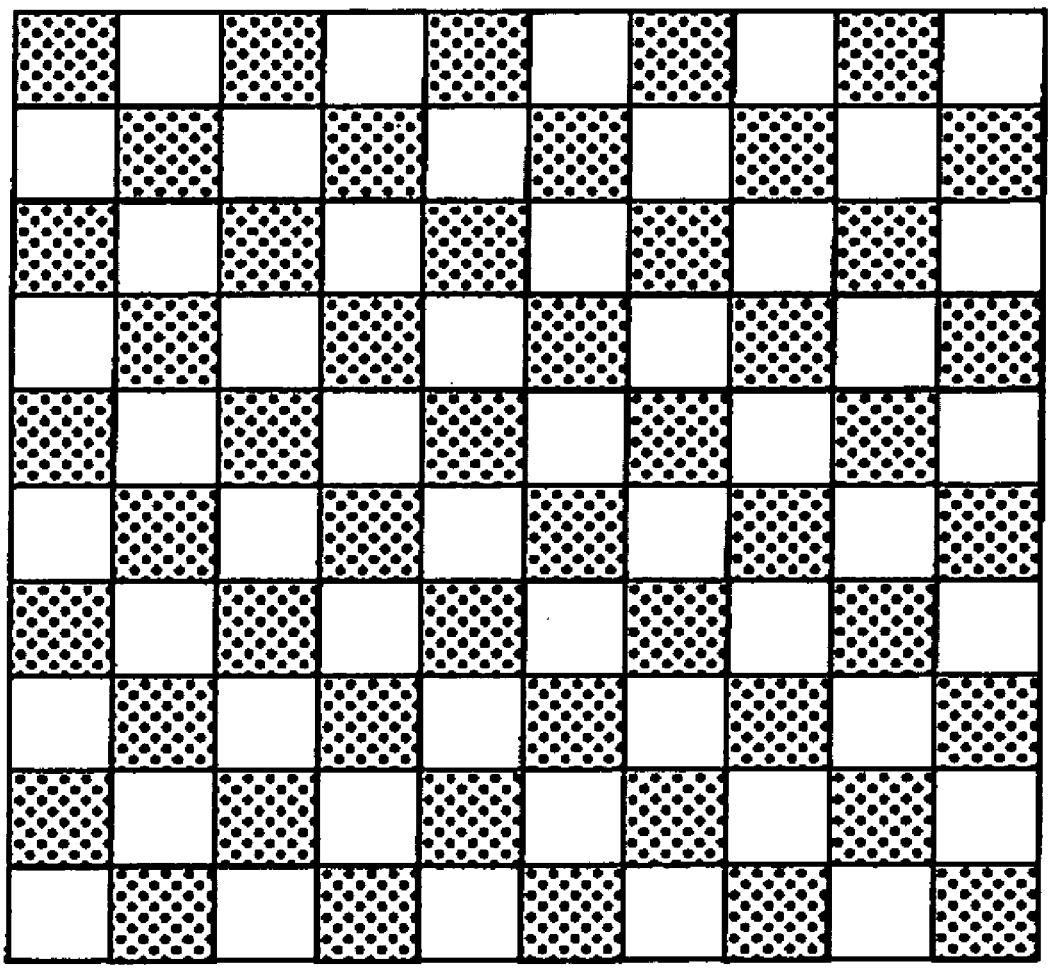
FIG. 9 depicts a checkerboard pattern.

FIG. 9 illustrates a typical chessboard or checker board pattern 900. A chessboard pattern combines many advantages when trying to detect defective pixels. If one pixel does not have the value it is supposed to have, a spot of five pixels (the defective pixel and its neighbors) will disturb enough of the intensity to appear in the CCD camera. Another advantage of the chessboard pattern is that its opposite pattern is a chessboard as well, which means that only two pictures are needed to observe the behavior of all the pixels at a given voltage. With the inventive method it is possible to find all defective pixels with only a small number of measurements. In one embodiment this is achieved by making an image of the chessboard pattern, and its inverted pattern, just so unsharp that a regular chessboard pattern becomes a uniform background in a detector plane, but that both erroneously deflected or flat pixels will stick out distinctively of this uniform background.

Figure 10:
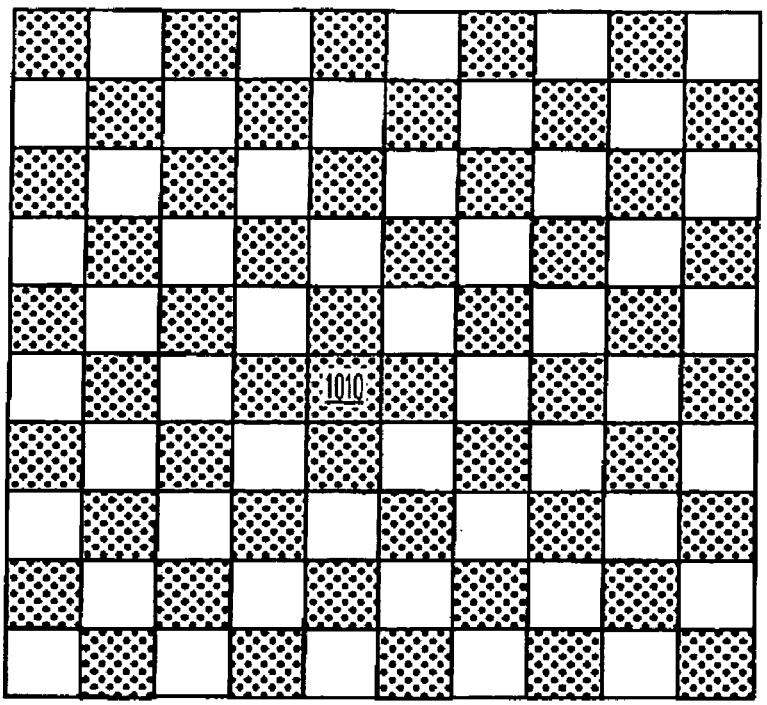
FIG. 10 depicts a defective off pixel in a checkerboard pattern.

FIG. 10 illustrates a defective pixel 1010 in a chessboard pattern. The defective pixel appears as a black pixel, i.e., fully deflected which may be caused by an electrical short cut between an adjacent deflected pixel and this one, which is supposed to be non deflected.

Figure 11:
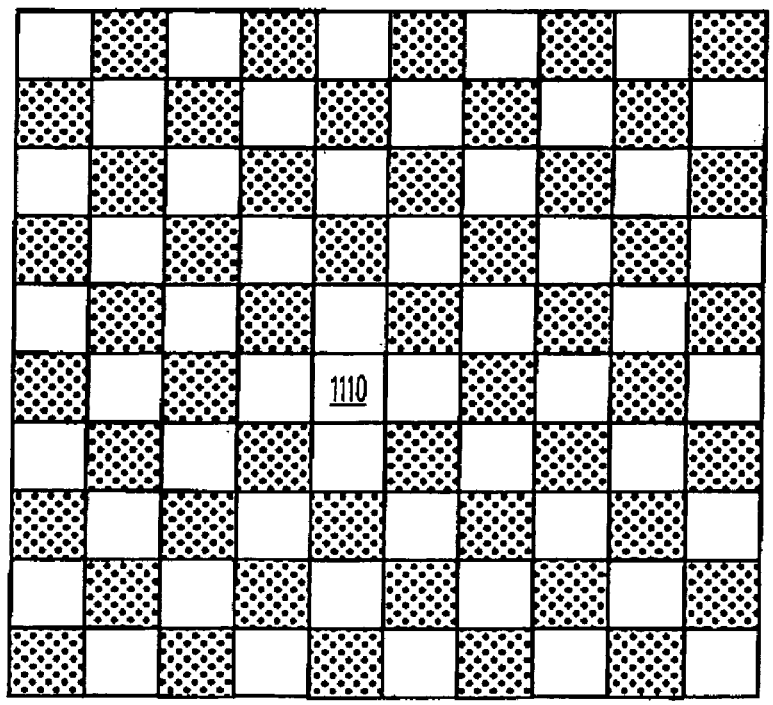
FIG. 11 depicts a defective on pixel in a checkerboard pattern.

FIG. 11 illustrates a defective pixel 1110 in another chessboard pattern, which chessboard pattern is the inverted pattern to the chessboard pattern in FIG. 10. The defective white pixel, which is supposed to be black, may be stiff and cannot be deflected. A mirror of poor reflectivity (a grey pixel surrounded by 4 black pixels), will be detected as a gray spot in the CCD camera.

FIGS. 9–11 illustrate pixels in the chessboard pattern being black and white pixels. However, a chessboard pattern may be constructed with pixels being white and grey, black and grey or light grey and dark grey.

Figure 12:
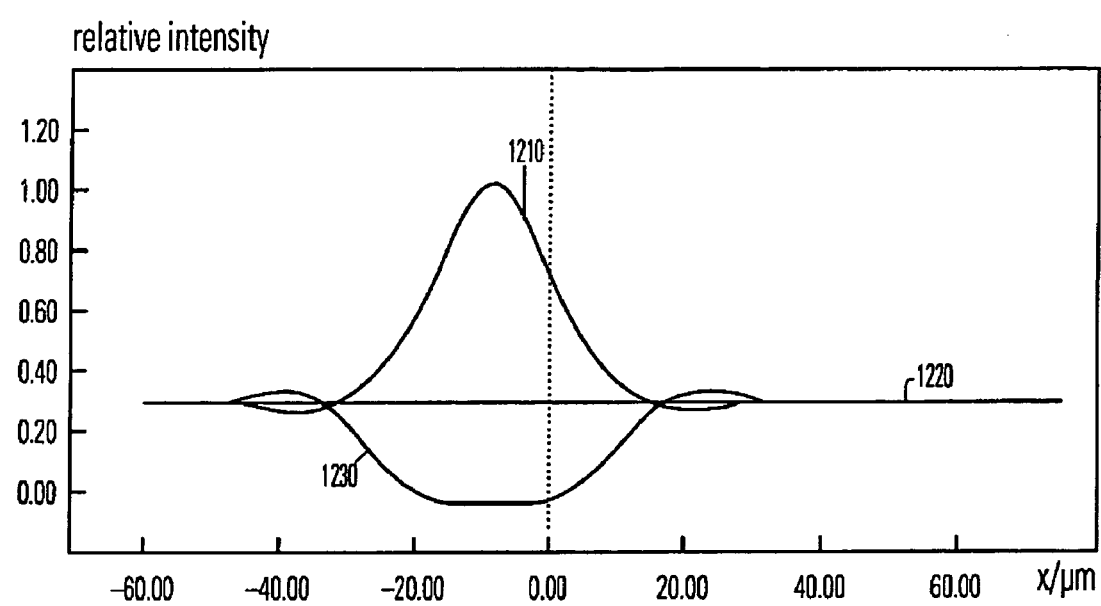
FIG. 12 depicts aerial cross sectional images of defects.

FIG. 12 illustrates a cross section of a resulting aerial image of defective pixels in a gray background. A horizontal line 1220 represents a background intensity that would be the response of an undisturbed checkerboard pattern. A pixel added, i.e., a white pixel, which is supposed to be black (see FIG. 11), is represented by curve 1230 and a pixel lacking, i.e., a black pixel, which is supposed to be white (see FIG. 10) is represented by curve 1210. The asymmetry in FIG. 12 comes from the fact that the regular checkerboard pattern gives only 25% light intensity in the zeroth diffraction order, which is 50% of light amplitude.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method to detect one or a plurality of defective pixels in a spatial light modulator, comprising the actions of:
   providing an electromagnetic radiation source to illuminate said spatial light modulator,
   arranging a reference pattern in said spatial light modulator,
   illuminating said spatial light modulator,
   determining a position of a reference pixel in said spatial light modulator by detecting a relayed image of said reference pattern in a detector arrangement,
   arranging a first pattern in said spatial light modulator, wherein features in an area of the first pattern are too small and closely spaced to be individually resolved by the detector arrangement,
   illuminating said spatial light modulator,
   detecting a relayed image of said first pattern in said detector arrangement,
   arranging at least a second pattern in said spatial light modulator, illuminating said spatial light modulator, detecting a relayed image of said at least a second pattern in said spatial light modulator analyzing said relayed images of said first pattern and said at least a second pattern to detect differences between said images and theoretical images thereof.

2. The method according to claim 1, wherein said first and second patterns are chessboard patterns, where the first chessboard pattern is inverted to the second chessboard pattern.

3. The method according to claim 1, wherein the relayed image is detected by a CCD camera.

4. The method according to claim 3, wherein the projection of a SLM pixel is bigger than a CCD pixel.

5. The method according to claim 1, wherein single pixels in the spatial light modulator are not resolved in said detector.

6. The method according to claim 5, wherein a spatial filter between the detector and the spatial light modulator is adapted to vary the degree of resolution on said detector.

7. The method according to claim 1, wherein at least one of said first and second patterns is detected by illuminating said pattern at least twice and detecting the relayed images separately.

8. The method according to claim 1, wherein at least one of said first and second patterns is comprised of only non deflected and fully deflected pixels.

9. The method according to claim 8, wherein said fully deflected pixels corresponds to a maximum degree of extinction by means of diffraction.

10. The method according to claim 2, wherein said chessboard patterns are comprised of only non-deflected and fully deflected pixels.

11. The method according to claim 2, wherein said chessboard patterns are comprised of only non-deflected and partially deflected pixels.

12. The method according to claim 10, wherein said fully deflected pixels corresponds to a maximum degree of extinction by means of diffraction.

13. The method according to claim 11, wherein said partially deflected pixels corresponds to partial extinction by means of diffraction.

14. The method according to claim 2, wherein said first and second patterns are each detected a plurality of times, where the pixels in said patterns are set to different degrees of deflection before each detection event.

15. The method according to claim 2, wherein said chessboard patterns are comprised of only fully-deflected and partially deflected pixels.

16. The method according to claim 2, wherein said chessboard patterns are comprised of pixels being in a first partially deflected state and a second partially deflected state.

17. A method to detect at least one defective pixel in a spatial light modulator comprising numerous pixel elements, comprising the actions of:

detecting a relayed image of a first chessboard pattern of pixels in said spatial light modulator by said detector, wherein squares of the first chessboard pattern are too small and closely spaced to be individually resolved by said detector, detecting a relayed image of a second chessboard pattern of pixels in said spatial light modulator, which is inverted to the first chessboard pattern, by said detector, analyzing the relayed images of said first and second chessboard patterns to detect differences between said detected images and theoretical images thereof.

18. The method according to claim 17, wherein the relayed images are detected by a CCD camera.

19. The method according to claim 18, wherein the projection of a SLM pixel is bigger than a CCD pixel.

20. The method according to claim 17, wherein single pixels in the spatial light modulator are not resolved in said detector.

21. The method according to claim 20, wherein a spatial filter between the detector and the spatial light modulator is adapted to vary the degree of resolution of said relayed image on said detector.

22. The method according to claim 17, wherein at least one of said first and second patterns is detected by illuminating said pattern at least twice and detecting the relayed images separately.

23. The method according to claim 17, wherein said chessboard patterns are comprised of only non-deflected and fully deflected pixels.

24. The method according to claim 17, wherein said chessboard patterns are comprised of only non-deflected and partially deflected pixels.

25. The method according to claim 23, wherein said fully deflected pixels corresponds to a maximum degree of extinction by means of diffraction.

26. The method according to claim 24, wherein said partially deflected pixels corresponds to partial extinction by means of diffraction.

27. The method according to claim 17, wherein said first and second patterns are each detected a plurality of times, where the pixels in said patterns are set to different degrees of deflection before each detection event.

28. The method according to claim 17, wherein said chessboard patterns are comprised of only fully-deflected and partially deflected pixels.

29. The method according to claim 17, wherein said chessboard patterns are comprised of pixels being in a first partially deflected state and a second partially deflected state.

30. The method according to claim 17, further comprising the action of:

identifying a SLM reference pixel in a detector pixel grid.

31. A method to detect at least one defective pixel in a spatial light modulator, comprising the action of:

making an image of a first chessboard pattern unsharp so that a regular chessboard pattern becomes a uniform background at a detector plane and a defective pixel becomes an irregularity in said uniform background at said plane and detectable by a detector.

32. The method according to claim 31, further comprising the action of:

making an image of a second chessboard pattern, which second pattern is inverted to said first pattern, unsharp so that a regular chessboard pattern becomes a uniform background at a detector plane and a defective pixel becomes an irregularity in said uniform background at said plane and detectable by a detector.

33. The method according to claim 31, wherein said detector is a CCD camera.

34. The method according to claim 33, wherein a projection of a SLM pixel onto said CCD is bigger than a CCD pixel.

35. The method according to claim 31, wherein said chessboard pattern is comprised of only non-deflected and fully deflected pixels.

36. The method according to claim 31, wherein said chessboard pattern is comprised of only non-deflected and partially deflected pixels.

37. The method according to claim 35, wherein said fully deflected pixels corresponds to a maximum degree of extinction by means of diffraction.

38. The method according to claim 36, wherein said partially deflected pixels corresponds to partial extinction by means of diffraction.

39. The method according to claim 31, wherein said chessboard pattern is comprised of only fully-deflected and partially deflected pixels.

40. The method according to claim 17, wherein said chessboard pattern is comprised of pixels being in a first partially deflected state and a second partially deflected state.

41. The method according to claim 32, wherein said chessboard pattern is comprised of only non-deflected and fully deflected pixels.

42. The method according to claim 32, wherein said chessboard pattern is comprised of only non-deflected and partially deflected pixels.

43. The method according to claim 41, wherein said fully deflected pixels corresponds to a maximum degree of extinction by means of diffraction.

44. The method according to claim 42, wherein said partially deflected pixels corresponds to partial extinction by means of diffraction.

45. The method according to claim 32, wherein said chessboard pattern is comprised of only fully-deflected and partially deflected pixels.

46. The method according to claim 32, wherein said chessboard pattern is comprised of pixels being in a first partially deflected state and a second partially deflected state.

47. The method according to claim 31, further comprising the action of:
    identifying an SLM reference pixel in a detector pixel grid.

* * * * *